US006963511B2

(12) United States Patent
Ashizawa

(10) Patent No.: US 6,963,511 B2
(45) Date of Patent: Nov. 8, 2005

(54) SEMICONDUCTOR INTEGRATED CIRCUIT

(75) Inventor: Tetsuo Ashizawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/900,287

(22) Filed: Jul. 28, 2004

(65) Prior Publication Data

US 2005/0201165 A1   Sep. 15, 2005

(30) Foreign Application Priority Data

Mar. 10, 2004 (JP) .............................. 2004-067646

(51) Int. Cl.$^7$ ................................................ G11C 7/00
(52) U.S. Cl. ..................... 365/200; 365/201; 365/225.7
(58) Field of Search ............................... 365/200, 201, 365/225.7, 230.08

(56) References Cited

U.S. PATENT DOCUMENTS 5,859,801 A * 1/1999 Poechmueller .............. 365/200
6,166,981 A * 12/2000 Kirihata et al. ........... 365/225.7
6,333,878 B2 * 12/2001 Ooishi ........................ 365/200
6,469,949 B1 * 10/2002 Hsu et al. ................. 365/225.7
6,804,156 B2 * 10/2004 Ito ............................. 365/201

FOREIGN PATENT DOCUMENTS

JP              60-182150           9/1985

* cited by examiner

Primary Examiner—Anh Phung
(74) Attorney, Agent, or Firm—Arent Fox PLLC

(57) ABSTRACT

A shift register is sequentially supplied via a clock pad and a data pad with a clock and data indicating whether or not an electric fuse circuit is cut off. The supply turns on a switch corresponding to an electric fuse circuit to cut off, and connects the electric fuse circuits to cut off to a voltage supply line. Here, by supplying a high voltage to the voltage supply line via a voltage pad, electric current flows through electric fuse circuits to cut off in each chip area, thereby cutting off the electric fuse circuits at the same time. Providing the clock pad, data pad, voltage pad common to the electric fuse circuits in each chip area makes it possible to reduce the size of a scribe area. This allows increase in the number of semiconductor chips producible per semiconductor wafer, resulting in reduced manufacturing cost thereof.

13 Claims, 12 Drawing Sheets ated circuit that has a plurality of chip areas each having a semiconductor chip formed therein and a peripheral area connecting the chip areas to each other.

SEMICONDUCTOR INTEGRATED CIRCUIT

CROSS REFERENCE TO RELATED APPLICATION

This application is based upon and claims the benefit of priority from Japanese Patent Application No. 2004-067646, filed on Mar. 10, 2004, the entire contents of which are incorporated herein by reference.

BACKGROUND OF THE INVENTION

1. Field of the Invention

The present invention relates to a semiconductor integrated circuit that has a plurality of chip areas each having a semiconductor chip formed therein and a peripheral area connecting the chip areas to each other.

2. Description of the Related Art

In order to improve yields and reduce chip cost, a semiconductor memory such as a DRAM (Dynamic Random Access Memory) has a redundancy memory cell (redundancy circuit) for relieving a defect in a memory cell during a fabrication process. The defect in the memory cell is relieved by replacing the defective memory cell by the redundancy memory cell during a test process.

Generally, a semiconductor memory having a redundancy memory cell has fuse circuits storing an address of a defective memory cell. In case of directly cutting off fuse portions in the fuse circuits, it is necessary to consider how laser beam irradiation to the fuse portions gives influence on their ambient internal circuits. Specifically, it is necessary to limit the arrangement of the ambient internal circuits. This lowers the degree of integration of the semiconductor memory, resulting in increased chip size.

In view of solving this problem, for example, Japanese Unexamined Patent Application Publication No. Sho 60-182150 has disclosed a semiconductor integrated circuit that adopts fuse circuits in which fuse portions are cut off by electric current and that has fuse cutting pads (pads for supplying the electric current to the fuse portions) in a scribe area. With this semiconductor integrated circuit, it is possible to realize highly integrated semiconductor memories, in other words, chip size reduction since no limitation has to be imposed on the arrangement of the ambient internal circuits and the fuse cutting pads are provided in the scribe area.

SUMMARY OF THE INVENTION

It is an object of the present invention to reduce manufacturing cost of a semiconductor chip having a fuse circuit for programming control information on an internal circuit. It is another object of the present invention to shorten the time required for a test process of a semiconductor integrated circuit that has a plurality of chip areas each having a semiconductor chip formed therein and a peripheral area connecting the chip areas to each other.

According to one of the aspects of the present invention, a semiconductor integrated circuit includes: a plurality of chip areas each having a semiconductor chip formed therein; and a peripheral area connecting the chip areas with each other. Each of the chip areas has a plurality of electric fuse circuits each for programming control information on an internal circuit of the semiconductor chip. The semiconductor chip in each of the chip areas may be, for example, a semiconductor memory having a redundancy circuit for defect relief, or a semiconductor chip having a timing circuit (a PLL circuit or the like) generating a desired timing signal. The electric fuse circuits store therein, for example, an address designating a portion having a defect when there is a defect in the semiconductor memory, or trimming information for adjusting a generation timing for the timing signal in the timing circuit.

The peripheral area has a shift register, a clock pad, a data pad, a voltage pad, and a connecting switch circuit. The peripheral area is, for example, a scribe area to cut to separate the chip areas from each other. The shift register is constituted of a plurality of latch circuits corresponding to the electric fuse circuits, respectively. The clock pad is connected to a clock terminal of each of the latch circuits in the shift register via a clock supply line. The data pad is connected to a data terminal of a latch circuit on an initial stage in the shift register via a data supply line. The voltage pad is connected to a voltage supply line. The connecting switch circuit is composed of a plurality of switches corresponding to the electric fuse circuits, respectively. The switches connect the voltage supply line to a corresponding one of the electric fuse circuits according to outputs of the latch circuits in the shift register.

In the semiconductor integrated circuit as described above, the clock supply line is supplied via the clock pad with a shift clock at a cycle equal to the number of the electric fuse circuits in each of the chip areas, and the data supply line is sequentially supplied via the data pad with desired data (indicating whether or not electric fuse circuits are to be cut off) in accordance with the cycle of the shift clock, thereby activating outputs of the latch circuits corresponding to the electric fuse circuits to be cut off. This turns on the switches corresponding to the electric fuse circuits to be cut off, connecting them to the voltage supply line. Supplying a high voltage to the voltage supply line via the voltage pad in this state will cause electric current to flow through the electric fuse circuit to be cut off. Then, the electric fuse circuits to be cut off are cut off at the same time.

Since the clock pad, the data pad, and the voltage pad are common to the plural electric fuse circuits (for example, the ones in each of the chip areas), it is possible to reduce the size of the peripheral area, compared with a case where a fuse cutting pad is provided for each electric fuse circuit. This allows the increase in the number of semiconductor chips producible per semiconductor integrated circuit (for example, a semiconductor wafer), resulting in reduced manufacturing cost of the semiconductor chips.

Further, since the plural electric fuse circuits can be cut off at a time, it is able to program the control information on the internal circuit of the semiconductor chip in a shorter time, compared with a case where the electric fuse circuits are cut off one by one. Therefore, the time required for a test process of the semiconductor integrated circuit can be shortened. Moreover, the present invention will makes a great effect when applied to a semiconductor integrated circuit which has a semiconductor memory with a redundancy circuit in each chip area and needs a large number of electric fuse circuits for storing failed addresses.

According to the aforesaid aspect of the present invention, it is preferable that the peripheral area has the shift register, the clock pad, the data pad, the voltage pad, and the connecting switch circuit for each of the chip areas. Relative positions of the clock pads, the data pads, and the voltage pads to the chip areas are identical with each other. In the semiconductor integrated circuit as described above, by use of a probe card having probes in contact with pads in each of the chip areas as well as probes in contact with the clock pad, the data pad, and the voltage pad, for example, it is made possible to perform both of a function test and a cutoff processing of the electric fuse circuits in each of the chip areas during a test process, without exchanging the probe cards. As a result, man-hours needed for the test process of the semiconductor integrated circuit can be reduced.

According to the aforesaid aspect of the present invention, it is preferable that the peripheral area has the shift register, the clock pad, the data pad, the voltage pad, and the connecting switch circuit for each chip row as chip areas in a row.

Since the clock pad, the data pad, and the voltage pad are shared by the electric fuse circuits in the chip areas in the same chip row, the size of the peripheral area can be further reduced compared with the case where the clock pad, the data pad, and the voltage pad are provided for each of the chip areas. This allows further increase in the number of semiconductor chips producible from the semiconductor integrated circuit, resulting in further reduced manufacturing cost of the semiconductor chips. In addition, since the electric fuse circuits in the chip areas in the same chip row are cut off at the same time, the time required for the cutoff process of the electric fuse circuits can be further shortened compared with the case where the electric fuse circuits are cut off in a unit of chip area. This can further shorten the time required for a test process of the semiconductor integrated circuit.

According to the aforesaid aspect of the present invention, it is preferable that the clock pad, the data pad, and the voltage pad are provided in a portion of the peripheral area corresponding to a head chip area for each of the chip rows. Here, the head chip area refers to a chip area corresponding to the latch circuit on the initial stage in the shift register. The peripheral area has three dummy pads for each of chip areas succeeding the head chip area. A relative position of the three dummy pads to each of the succeeding chip areas is identical with a relative position of each of the clock pad, the data pad, and the voltage pad to each of the head chip areas.

In the semiconductor integrated circuit as described above, a function test is conducted on each of the chip areas in the same chip row during a test process by using, for example, a probe card having probes in contact with pads in each of the chip areas as well as probes in contact with the clock pad, the data pad, and the voltage pad. Then, upon completion of the function test, the electric fuse circuits in the chip areas in the same chip row are cut off at the same time by making the probes in contact with the pads in the head chip area, the clock pad, the data pad, and the voltage pad respectively without exchanging the probe cards. Therefore, it is possible to eliminate the need for exchanging the probe cards when the process proceeds to the cutoff processing of the electric fuse circuits from the function test, and to reduce man-hours taken for the test process of the semiconductor integrated circuit.

According to the aforesaid aspect of the present invention, it is preferable that the peripheral area has, for each of the chip rows, a dummy chip area having a same pad arrangement as a pad arrangement in each of the chip areas. Three of pads in each of the dummy chip areas are the clock pad, the data pad, and the voltage pad.

In the semiconductor integrated circuit as described above, a function test is conducted on each of the chip areas in the same row during a test process, by use of a probe card having only probes in contact with pads in each of the chip areas (a typical probe card for a function test), for example. Then, after the function test, the electric fuse circuits are cut off at a time in the chip areas in the same chip row by making the probes in contact with the pads in the dummy chip area without exchanging the probe cards. This eliminates the need for exchanging the probe cards when the process proceeds to the cutoff processing of the electric fuse circuits from the function test, thereby reducing man-hours needed for the test process of the semiconductor integrated circuit.

According to the aforesaid aspect of the present invention, it is preferable that the peripheral area includes the shift register, the clock pad, the data pad, the voltage pad, and the connecting switch circuit which are common to all chip rows as the chip areas in rows.

Providing the clock pad, the data pad, and the voltage pad common to the electric fuse circuits in all the chip rows of the chip areas makes it possible to further reduce the size of the peripheral area, compared with the case where the clock pad, the data pad, and the voltage pad are provided for each of the chip areas in each row. This allows further increase in the number of semiconductor chips producible per semiconductor integrated circuit, resulting in further reduced manufacturing cost of the semiconductor chips. It is also possible to shorten the time required for the cutoff process of the electric fuse circuits since the electric fuse circuits in the chip areas in all of the rows are cut off at a time, compared with the case where the electric fuse circuits are cut off in a unit of chip area or chip row. Therefore, the time required for a test process of the semiconductor integrated circuit can be further shortened.

According to the aforesaid aspect of the present invention, it is preferable that the clock pad, the data pad, and the voltage pad are common to all of chip areas and provided in a portion of the peripheral area corresponding to a head chip area. Here, the head chip area refers to the chip area corresponding to the latch circuit on the initial stage in the shift register. The peripheral area has three dummy pads for each of chip areas succeeding the head chip area. A relative position of each of the succeeding chip areas to corresponding three dummy pads is the same as that of the head chip area to the clock pad, the data pad, and the voltage pad.

In the semiconductor integrated circuit as described above, a function test is conducted on all of the chip areas during a test process by using, for example, a probe card having probes made in contact with pads in each of the chip areas as well as probes made in contact with the clock pad, the data pad, and the voltage pad. Then, upon completion of the function test, the electric fuse circuits in the chip areas in the same row are cut off at the same time by making the probes in contact with the pads in the head chip area, the clock pad, the data pad, and the voltage pad respectively without exchanging the probe cards. Therefore, it is possible to eliminate the need for exchanging the probe cards when the process proceeds to the cutoff processing of the electric fuse circuits from the function test, and to reduce man-hours taken for the test process of the semiconductor integrated circuit.

According to the aforesaid aspect of the present invention, it is preferable that the peripheral area includes a dummy chip area which is common to all chip rows, and has a same pad arrangement as a pad arrangement in each of the chip areas. Three of pads in the dummy chip area are the clock pad, the data pad, and the voltage pad.

In the semiconductor integrated circuit as described above, a function test is conducted on the each of the chip areas in the same chip row during a test process, by use of a probe card having only probes made in contact with pads in each of the chip areas (a typical probe card for a function test), for example. Then, after the function test, the electric fuse circuits are cut off at a time in the chip areas in all of the chip rows by making the probes in contact with the pads in the dummy chip area without exchanging the probe cards. This eliminates the need for exchanging the probe cards when the process proceeds to the cutoff processing of the electric fuse circuits from the function test, thereby reducing man-hours needed for the test process of the semiconductor integrated circuit.

According to the aforesaid aspect of the present invention, it is preferable that the peripheral area has a connecting pattern of the clock supply lines, a connecting pattern of data terminals of the latch circuits, and a connecting pattern of the voltage supply lines so as to couple to each other the clock supply lines, the latch circuits, and the voltage supply lines all disposed for the chip rows adjacent to each other. All the connecting lines are formed by direct lithography with use of an electron beam.

The connecting patterns of the clock supply lines, of the data terminals of the latch circuits, and of the voltage supply lines are formed by direct lithography, so that the formation of these patterns can be facilitated which would be difficult to form by transfer or the like using a reticle.

According to the aforesaid aspect of the present invention, it is preferable that the peripheral area includes a voltage monitor pad on the connecting pattern of the voltage supply lines.

During voltage supply to the electric fuse circuits via the voltage supply line, the voltage lowers as it approaches the end of the voltage supply line. The electric fuse circuits may not be normally cut off due to a drop in voltage of the voltage supply line, which may possibly cause a malfunction of an internal circuit of a semiconductor chip. The present invention makes it possible to prevent an erroneous cutoff of the electric fuse circuits since it can monitor the voltage drop in the voltage supply line via the voltage monitor pad.

BRIEF DESCRIPTION OF THE DRAWINGS

The nature, principle, and utility of the invention will become more apparent from the following detailed description when read in conjunction with the accompanying drawings in which like parts are designated by identical reference numbers, in which.

DESCRIPTION OF THE PREFERRED EMBODIMENTS

The present invention has been made for the purpose of solving the following problem.

With a semiconductor integrated circuit having a fuse cutting pad for each fuse circuit, the larger the number of fuse circuits is, the larger the number of the fuse cutting pads in the scribe area is, and accordingly, the larger the size of the scribe area has to be.

Consequently, this lowers the number of semiconductor chips producible per a semiconductor integrated circuit (for example, a semiconductor wafer) that has a plurality of chip areas each having a semiconductor chip formed therein and a peripheral area that connects the chip areas to each other. Therefore, it is not able to fully take advantage of manufacturing cost reduction brought by chip size reduction. Such a problem is conspicuous especially in a semiconductor memory having a redundancy circuit since it has a large number of fuse circuits that store addresses of defective memory cells.

Figure 1:
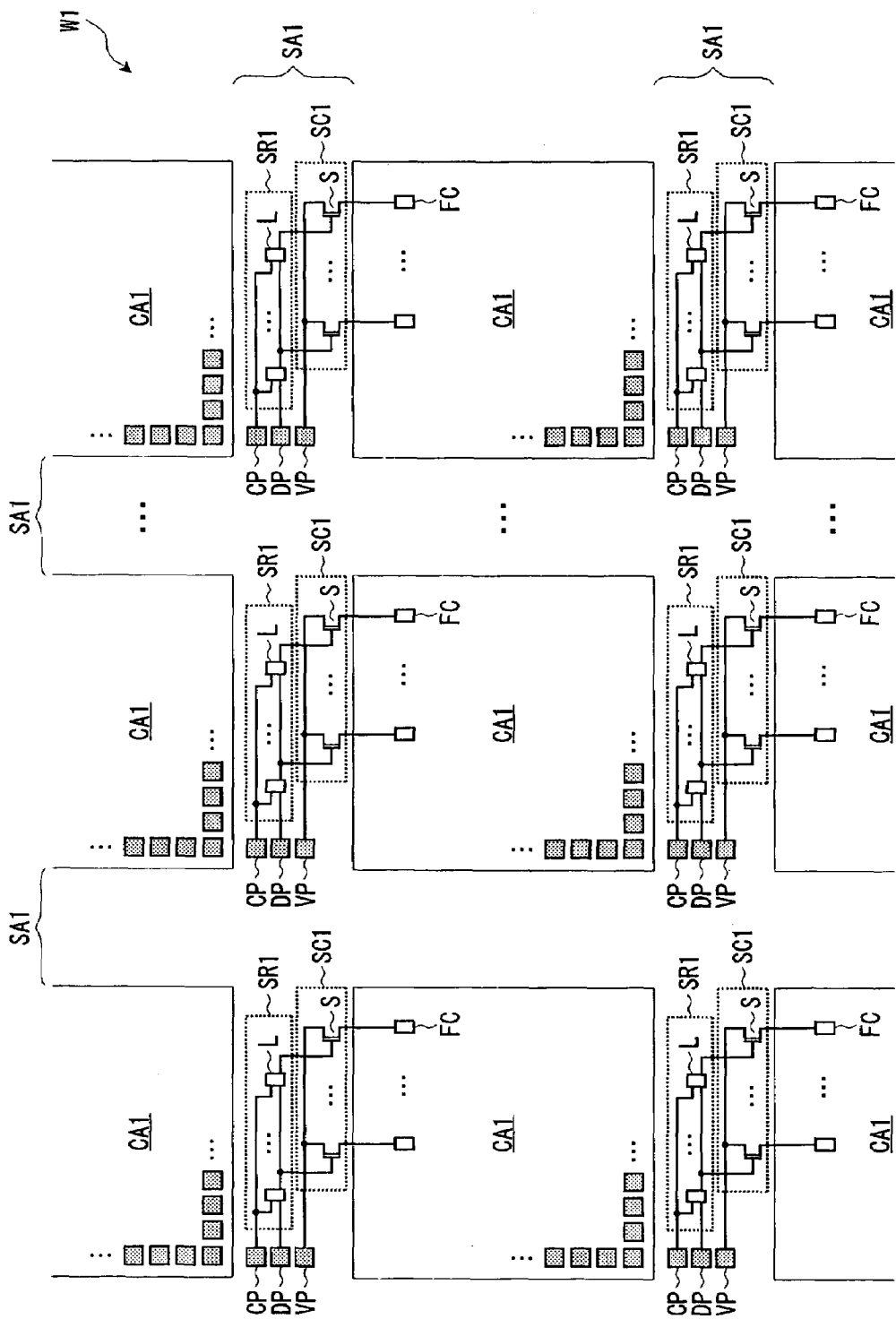
FIG. 1 shows a first embodiment of the semiconductor integrated circuit of the present invention.

The embodiments of the present invention will be described with reference to the drawings in the following. FIG. 1 shows a first embodiment of the semiconductor integrated circuit of the present invention.

The semiconductor integrated circuit of the present invention is formed as a semiconductor wafer W1 having a plurality of chip areas CA1 and a scribe area (peripheral area) SA1. A semiconductor chip formed in each of the chip areas CA1 is, for example, a DRAM having a redundancy circuit (not shown) for defect relief. The scribe area SA1 is an area to cut in a dicing process of the chip areas CA1 (namely, the DRAMs), and connects the chip areas CA1 to each other.

Each of the chip areas CA1 has a plurality of electric fuse circuits FC each programming a failed address representing a defective portion when there is a defect in the DRAM. The electric fuse circuit FC is a fuse circuit to a fuse portion by flowing electric current therethrough, and is also referred to a current fuse circuit. The scribe area SA1 extends to the lateral direction in FIG. 1 and has, for each of the chip areas CA1, a shift register SR1, a clock pad CP for supplying a shift clock to the shift register SR1, a data pad DP for supplying shift data to the shift register SR1, a voltage pad VP for supplying voltage used for a cutoff process of the electric fuse circuits FC, and a connecting switch circuit SC1, which are provided at positions adjacent to each of the chip areas CA1. All relative positions of the chip areas CA1 to the respective clock pads CP, data pads DP, voltage pads VP, shift registers SR1, and connecting switch circuits SC1 are the same as each other. Therefore, the semiconductor wafer W1 can be formed by repeatedly performing transfer using a common reticle.

Figure 2:
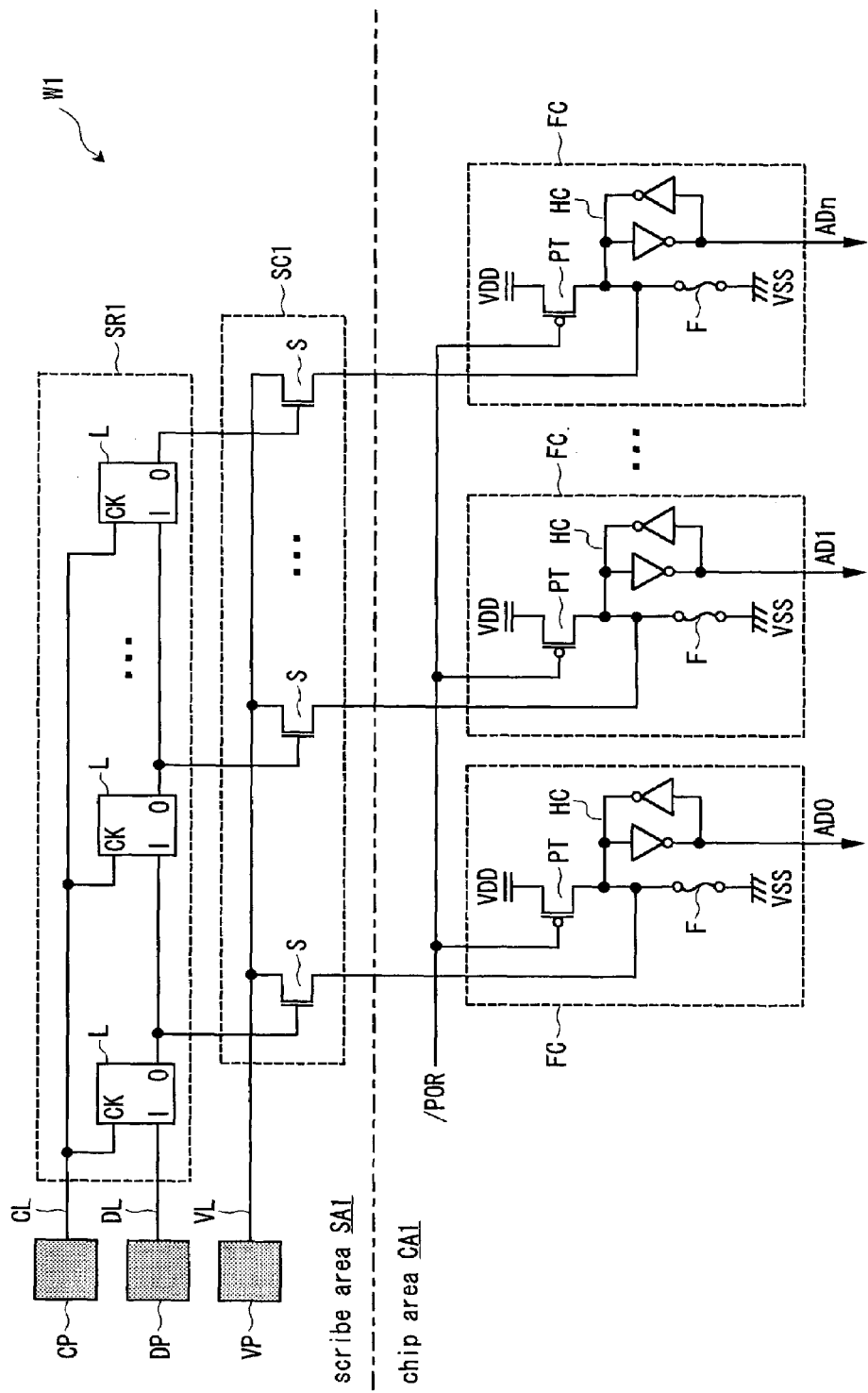
FIG. 2 shows an essential portion of a semiconductor wafer in FIG. 1.

FIG. 2 shows an essential portion of the semiconductor wafer W1 in FIG. 1.

Each of the electric fuse circuits FC has a PMOS transistor PT, an electric fuse F, and a holding circuit HC. A source and a drain of the pMOS transistor PT are connected to a power supply line VDD (for example, 1.0 V to 1.2 V) and one end of the electric fuse F respectively.

A gate of the pMOS transistor PT receives a power-on reset signal /POR supplied from a power-on reset circuit (not shown) in the chip area CA1 and is activated at a low level while the DRAM is in a power-on state. The other end of the electric fuse F is connected to a ground line VSS. The holding circuit HC is constituted of two inverters connected to each other in a ring form. An input of the holding circuit HC is connected to the drain of the pMOS transistor PT and one end of the electric fuse F. Outputs of the holding circuits HC are supplied as failed addresses AD0 to ADn to a circuit (not shown) for switching a defective circuit to a redundancy circuit.

The shift register SR1 is constituted of a plurality of latch circuits L corresponding to the electric fuse circuits FC respectively. The clock pad CP is connected to clock terminals CK of the respective latch circuits L in the shift register SR1 via a clock supply line CL. The data pad DP is connected to a data input terminal I of the latch circuit L on an initial stage (the latch circuit L on the left end in the drawing) in the shift register SR1 via a data supply line DL. The voltage pad VP is connected to a voltage supply line VL.

The connecting switch circuit SC1 is constituted of a plurality of switches S corresponding to the respective electric fuse circuits FC. Each of the switches S is constituted of an nMOS transistor. A source and a drain of each of the switches S are connected to one end of the electric fuse F in the corresponding electric fuse circuit FC and the voltage supply line VL respectively. A gate of each of the switches S receives an output of the corresponding latch circuit L in the shift resister SR1. This means that the switch S connects the voltage supply line VL to the corresponding electric fuse circuit FC (the electric fuse F) according to the output of the latch circuit L in the shift register SR1.

Here, a test process of the semiconductor wafer W1 in FIG. 1 will be described.

First, a function test is conducted on the chip area CA1 disposed at a predetermined position (for example, the uppermost chip area CA1 on the left end in the semiconductor wafer W1). When a defect is not detected in the DRAM through the function test, the next chip area CA1 is subjected to the function test, shifting to a different position in the semiconductor wafer W1. When a defect is detected in the DRAM through the function test, the following processing is executed in order to program failed addresses in the electric fuse circuits FC in this chip area CA1.

Figure 3:
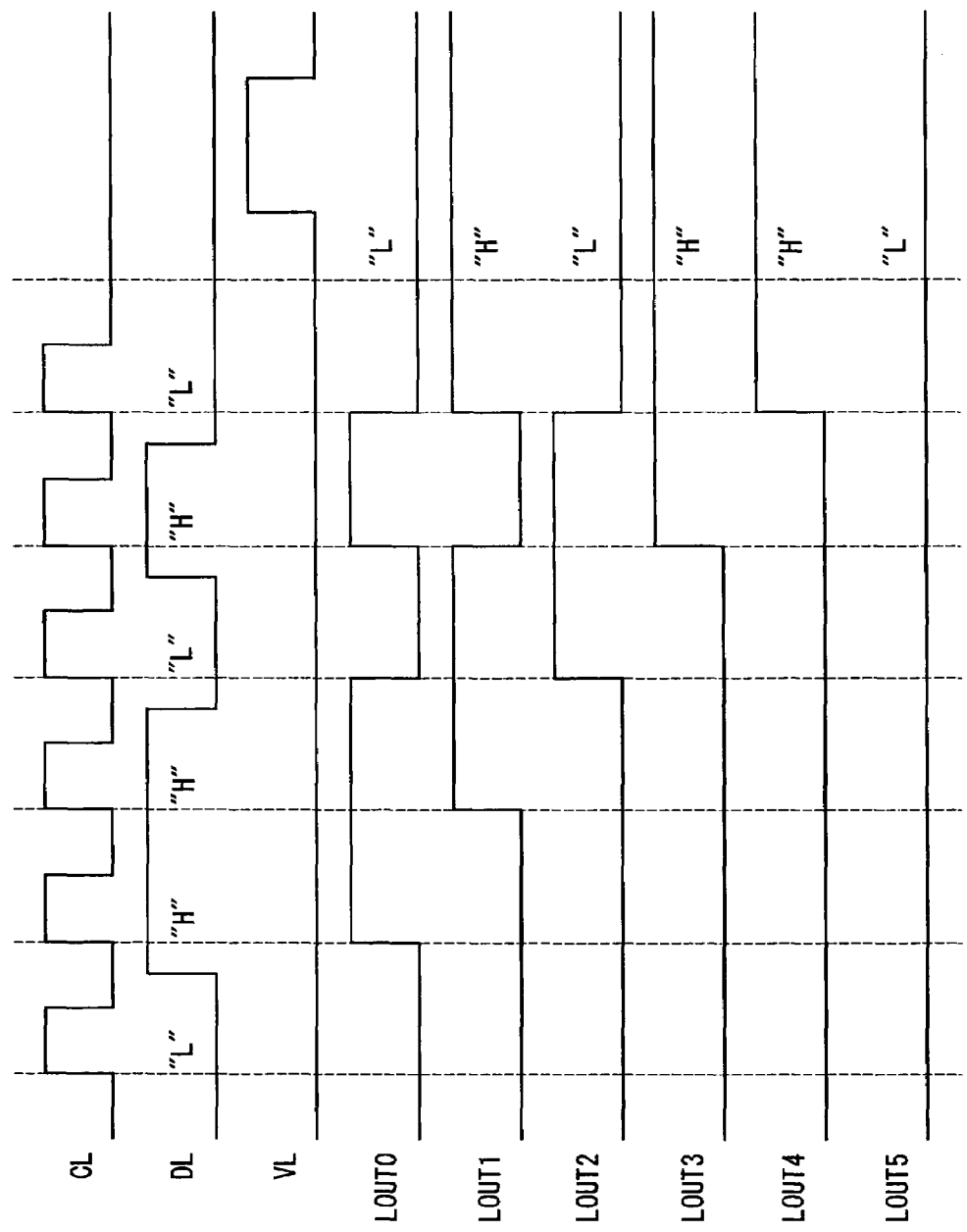
FIG. 3 is a timing chart showing a failed address programming process in the first embodiment.

FIG. 3 shows a failed address programming process in the first embodiment. In this example, the number of the electric fuse circuits FC in each of the chip areas CA1 is assumed to be six for simplicity. Therefore, the shift register SR1 is constituted of six latch circuits L, and the connecting switch circuit SC1 is constituted of six switches S. The outputs of the latch circuits L on the first to sixth stages in the shift register SR1 are denoted by LOUT0 to LOUT5 respectively.

First, the shift clock with six cycles is sequentially supplied to the clock supply line CL (namely, the shift register SR1) via the clock pad CP, and shift data "L", "H", "H", "L", "H", "L" corresponding to the failed addresses obtained by the function test are sequentially supplied to the data supply line DL via the data pad DP, in response to the respective cycles of the shift clock. Triggered by this, the shift register SR1 executes the shift operation six times, and the outputs LOUT0 to LOUT5 of the latch circuits L are set to "L", "H", "L", "H", "H", and "L" respectively. Accordingly, the switches S corresponding to the latch circuits L on the second, fourth, and fifth stages are turned on. In this state, when high voltage (for example, 2.0 V to 3.3 V) is supplied to the voltage supply line VL via the voltage pad VP, electric current flows through the electric fuses F in the electric fuse circuits FC corresponding to the latch circuits L on the second, fourth, and fifth stages. Then, the electric fuses F in the electric fuse circuits FC corresponding to the second, fourth, and fifth latch circuits L are cut off.

When the pMOS transistor PT in each of the electric fuse circuits FC is turned on in response to the activation (a falling edge) of the power-on reset signal /POR, the input of the holding circuit HC is connected to the power supply line VDD, so that the output of the holding circuit HC is fixed to "L". When the pMOS transistor PT turns off in response to the deactivation (rising edge) of the power-on reset signal /POR, if the electric fuse F has been cut off, the output of the holding circuit HC does not change from "L" since the input of the holding circuit HC is disconnected from the ground line VSS. On the other hand, if the electric fuse F has not been cut off, the output of the holding circuit HC changes to "H" since the input of the holding circuit HC is connected to the ground line VSS. Therefore, in the above-described example, the outputs of the holding circuits HC in the electric fuse circuits FC corresponding to the latch circuits L on the second, fourth, and fifth stages are all fixed to "L". On the other hand, the outputs of the holding circuits HC in the electric fuse circuits FC corresponding to the latch circuits L on the first, third, and sixth stages are all fixed to "H".

Specifically, the 6-bit failed addresses AD [5:0] are set to "100101". Here, the failed address programming process is completed. Thereafter, the function test is conducted on the next chip area CA1 disposed at a different position in the semiconductor wafer W1.

Figure 4:
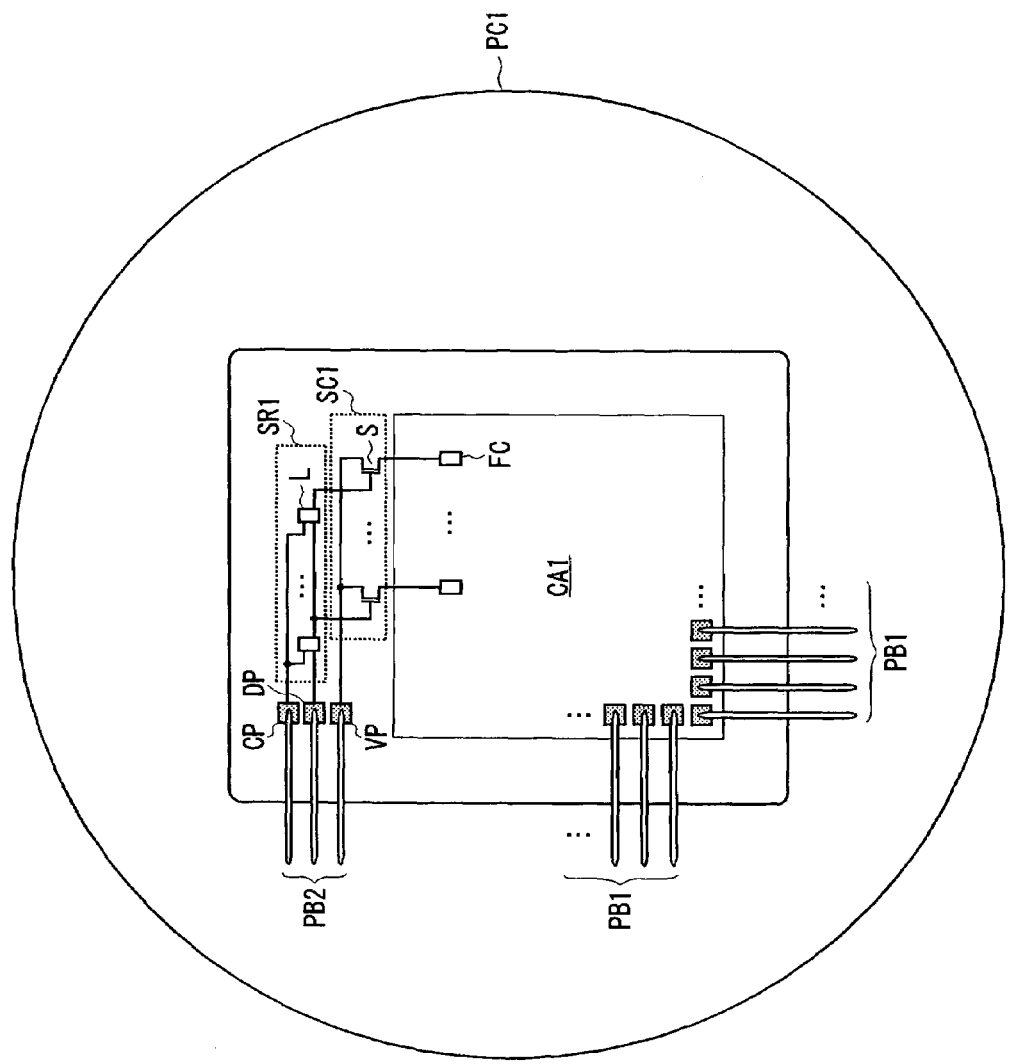
FIG. 4 shows a probe card used in a test process of the semiconductor wafer in FIG. 1.

FIG. 4 shows a probe card used in the test process of the semiconductor wafer W1 in FIG. 1.

A probe card PC1 has probes PB1 (probes for function test) that are brought into contact with respective pads in each of the chip areas CA1 as well as probes PB2 (probes for failed address programming) that are brought into contact with the clock pad CP, the data pad DP, and the voltage pad VP respectively.

In the semiconductor wafer W1, all relative positions of the chip areas CA1 to their corresponding clock pads CP, data pads DP, and voltage pads VP are the same with each other. Therefore, the use of the probe card PC1 in the test process of the semiconductor wafer W1 makes it possible to execute both the function test and the failed address programming process for each of the chip areas CA1 without any probe card exchange. Since no probe card exchange is required at the transition from the function test to the failed address programming process, man-hours of the test process of the semiconductor wafer W1 can be saved.

As described above, in the first embodiment, since the clock pad CP, the data pad DP, and the voltage pad VP are common to the electric fuse circuits FC in each of the chip areas CA1, the size of the scribe area SA1 can be reduced compared with a case where a fuse cutting pad is provided for each of the electric fuse circuits FC. This allows the increase in the number of semiconductor chips producible from the semiconductor wafer W1, resulting in reduced manufacturing cost of the semiconductor chips.

Moreover, cutting off all the electric fuse circuits FC in each of the chip areas CA1 at the same time makes it possible to program the failed addresses in a shorter time compared with a case where the electric fuse circuits FC are cut off one by one. In other words, it is able to shorten the time required for the test process of the semiconductor wafer W1. Further, the use of the probe card PC1 in the test process enables both the function test and the cutoff processing to the electric fuse circuits FC to be executed for each of the chip areas CA1 without any probe card exchange. This results in reducing man-hours of the test process of the semiconductor wafer W1.

Figure 5:
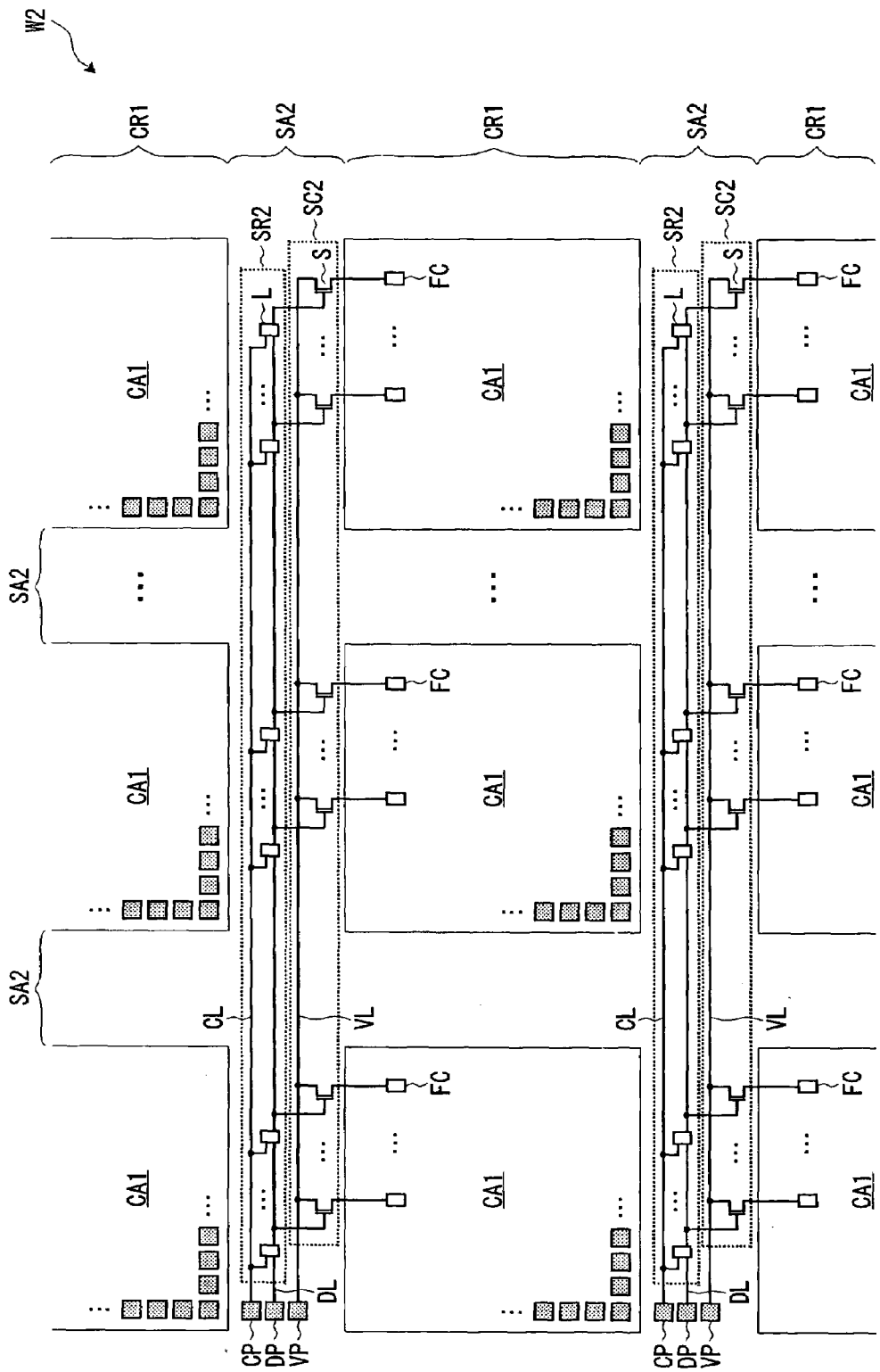
FIG. 5 shows a second embodiment of the semiconductor integrated circuit of the present invention.

FIG. 5 shows the semiconductor integrated circuit according to the second embodiment of the present invention. The same reference numerals and symbols are used to designate the same element as the elements described in the first embodiment, and detailed explanation thereof will be omitted.

The semiconductor integrated circuit of the present invention is formed as a semiconductor wafer W2 having a plurality of chip areas CA1 and a scribe area (peripheral area) SA2. Similarly to the scribe area SA1 of the first embodiment, the scribe area SA2 is an area that is cut in a dicing process of the chip areas CA1 (namely, DRAMs), and connects the chip areas CA1 to each other.

The scribe area SA2 extends to the lateral direction in FIG. 5 and has a shift register SR2, a clock pad CP, a data pad DP, a voltage pad VP, and a connecting switch circuit SC2 for each chip row CR1. Here, the chip row CR1 is constituted of the chip areas CA1 aligned in a row in the lateral direction in FIG. 5.

The configuration of the shift register SR2 is the same as that of the shift register SR1 of the first embodiment except the number of latch circuits L. The configuration of the connecting switch circuit SC2 is the same as that of the connecting switch circuit SC1 of the first embodiment except the number of switches S. The clock pad CP, the data pad DP, and the voltage pad VP are positioned adjacent to the chip area CA1 corresponding to the latch circuit L on an initial stage in the shift register SR2 (the chip area CA1 on the left end in the drawing).

Figure 6:
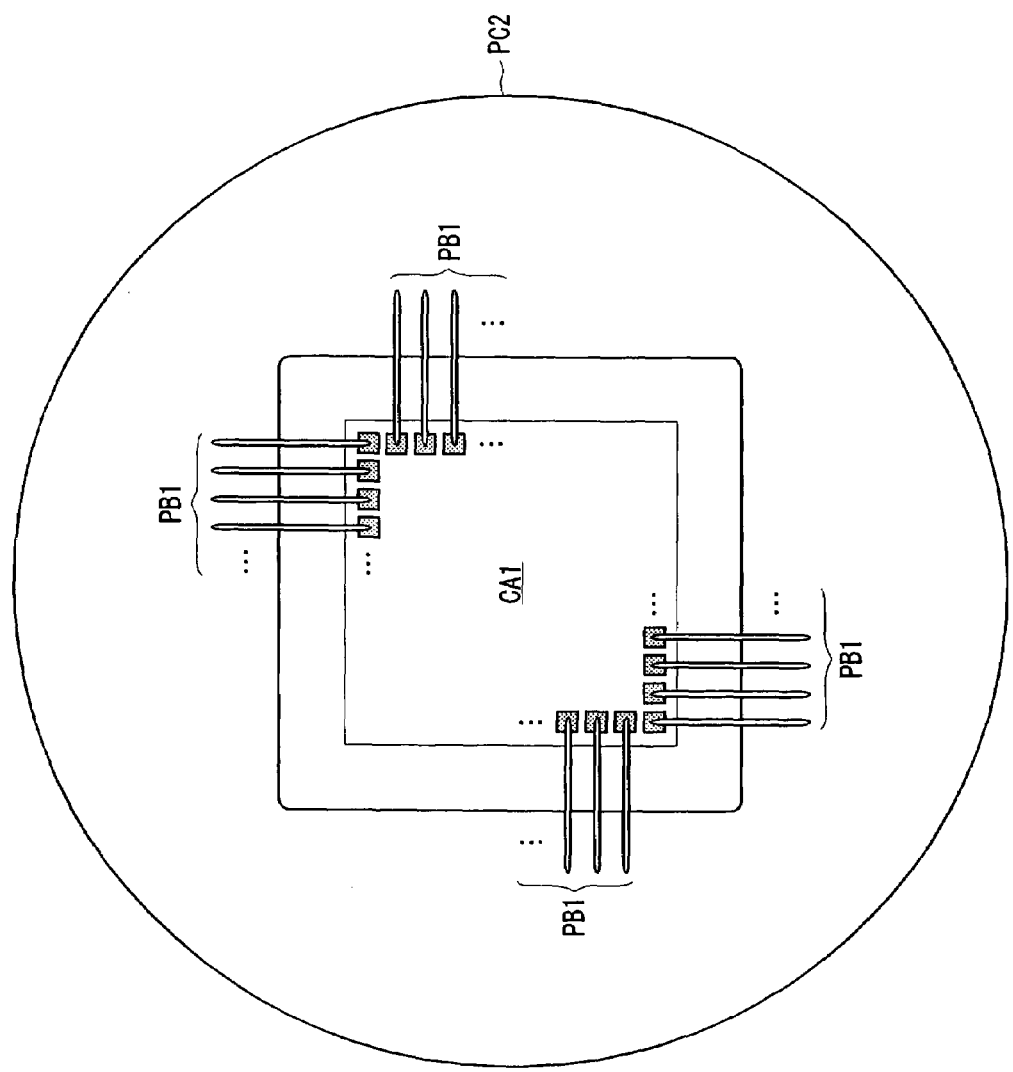
FIG. 6 shows a probe card used in a test process of the semiconductor wafer in FIG. 5.

FIG. 6 shows a probe card used in a test process (a function test) of the semiconductor wafer W2 in FIG. 5. A probe card PC2 only has probes PB1 (probes for function test) brought into contact with pads in each of the chip areas CA1 respectively.

Figure 7:
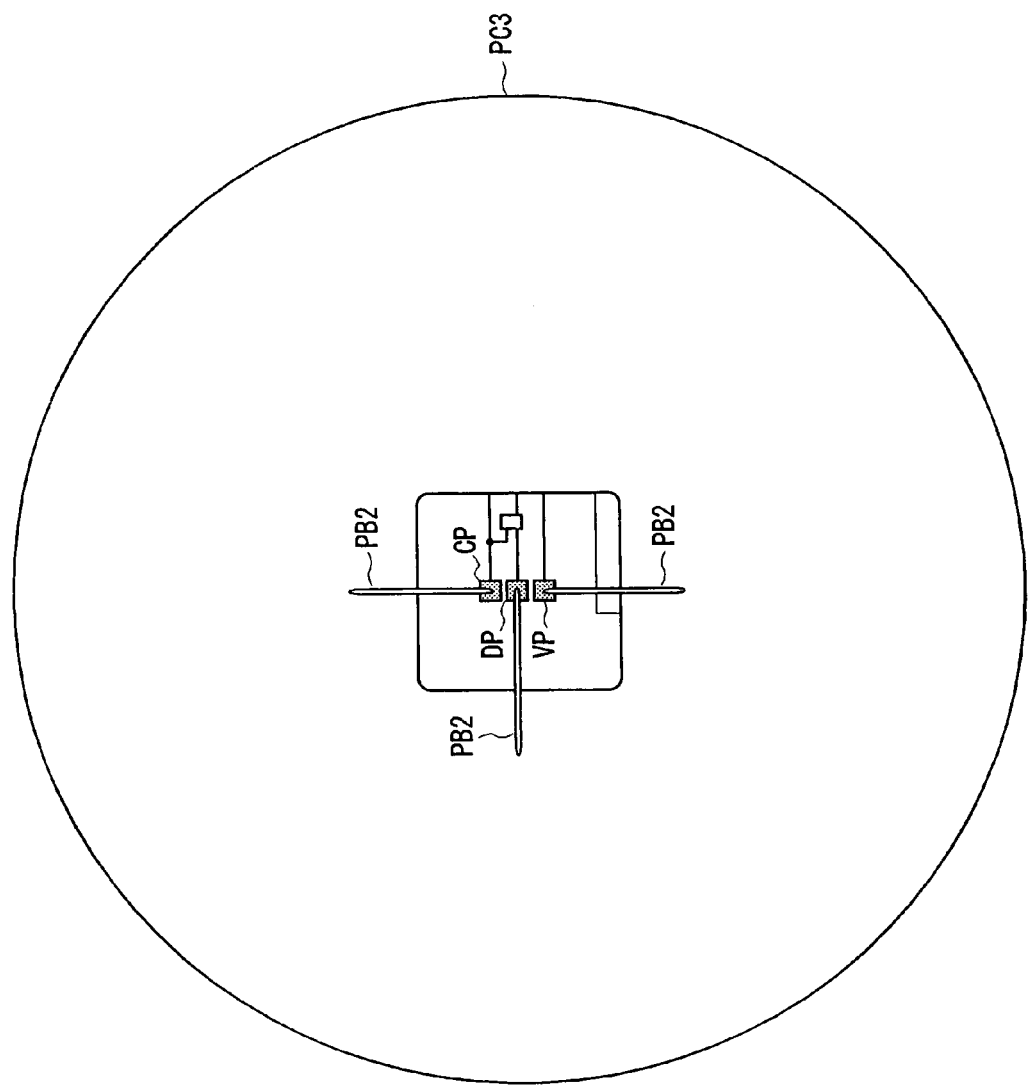
FIG. 7 shows a probe card used in a test process of the semiconductor wafer in FIG. 5.

FIG. 7 shows a probe card used in a test process (a failed address programming process) of the semiconductor wafer W2 in FIG. 5. A probe card PC3 has only probes PB2 (probes for failed address programming process) brought into contact with the clock pad CP, the data pad DP, and the voltage pad VP respectively.

Here, the test process of the semiconductor wafer W2 in FIG. 5 will be described.

First, the function test is conducted on each of the chip areas CA1 in the same chip row CR1 using the probe card PC2 for function test (FIG. 6). At this time, the chip areas CA1 where defects in DRAMs are detected by the function test and the failed addresses thereof are stored. Next, through the use of the probe card PC3 for failed address programming process (FIG. 7), the probes are brought into contact with the clock pad CP, the data pad DP, and the voltage pad respectively, and the failed address programming process is executed for each of the chip areas CA1 in the same chip row CR1, similarly to the first embodiment. Therefore, the electric fuse circuits FC of the chip areas CA1 in the same chip row CR1 are cut off at the same time. This further shortens the time required for the cutoff process of the electric fuse circuits FC compared with the case where the electric fuse circuits FC are cut off in a unit of the chip areas CA1 (the first embodiment). Consequently, the time required for the test process of the semiconductor wafer W2 is further shortened.

As described above, the same effects as those of the first embodiment are also obtainable in the second embodiment. In addition, since the clock pad CP, the data pad DP, and the voltage pad VP are common to the electric fuse circuits FC in the chip areas CA1 in the same chip row CR1, the size of the scribe area SA2 can be further reduced compared with the case where the clock pad CP, the data pad DP, and the voltage pad VP are provided for each of the chip areas CA1. This allows further increase in the number of semiconductor chips producible from the semiconductor wafer W2, resulting in further reduced manufacturing cost of the semiconductor chips. Moreover, the electric fuse circuits FC in the chip areas CA1 in the same chip row CR1 can be cut off at the same time, the time required for the cutoff process of the electric fuse circuits FC can be further shortened compared with the case where the electric fuse circuits FC are cut off in a unit of the chip areas CA1. In other words, the time required for the test process of the semiconductor wafer W2 can be further shortened.

Figure 8:
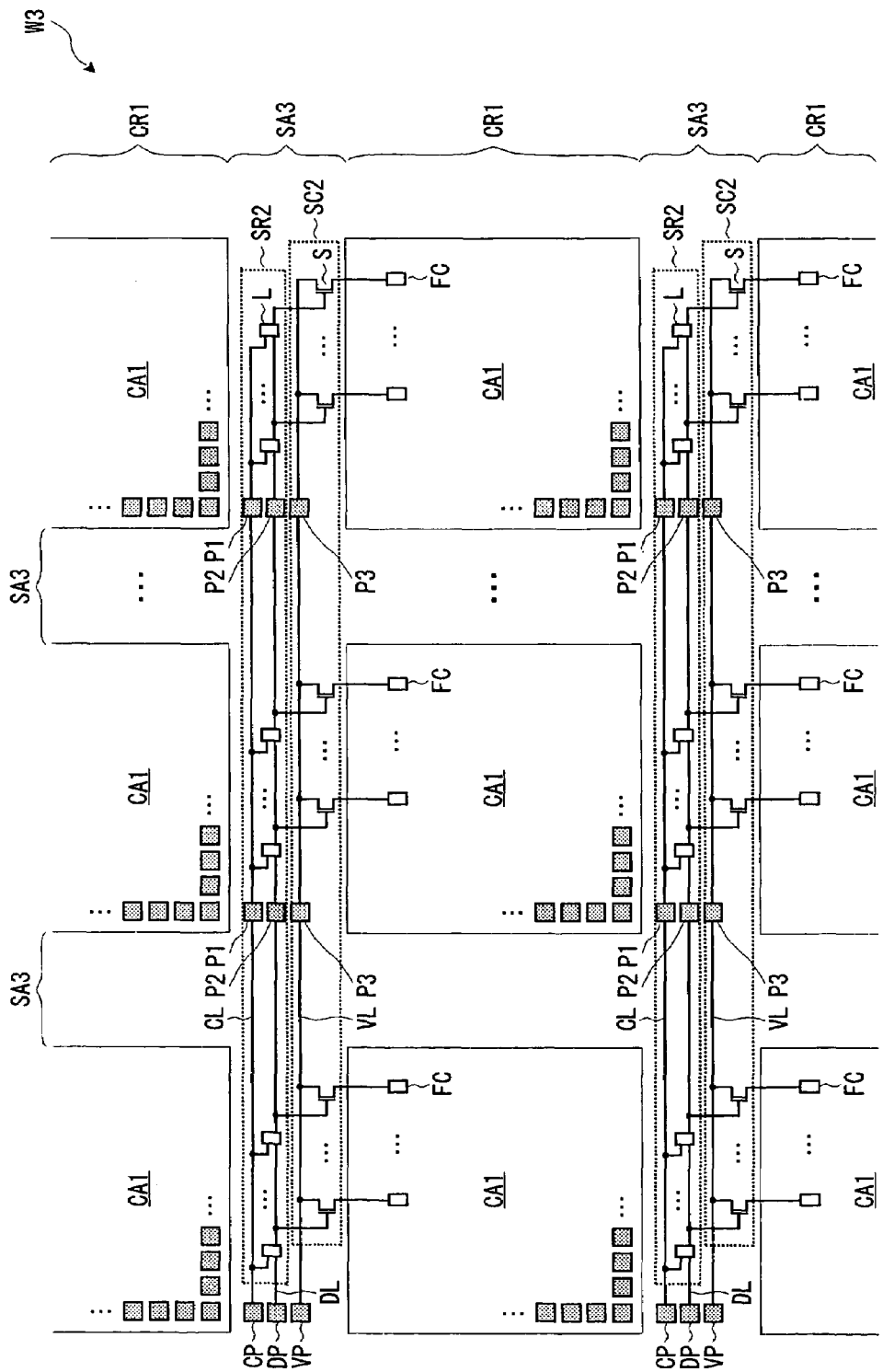
FIG. 8 shows a third embodiment of the semiconductor integrated circuit of the present invention.

FIG. 8 shows the semiconductor integrated circuit according to the third embodiment of the present invention. The same reference numerals and symbols are used to designate the same element as the elements described in the first and second embodiments, and detailed explanation thereof will be omitted.

The semiconductor integrated circuit of the present invention is formed as a semiconductor wafer W3 having a plurality of chip areas CA1 and a scribe area (peripheral area) SA3. Similarly to the scribe area SA1 of the first embodiment, the scribe area SA3 is an area that is cut in a dicing process of the chip areas CA1 (namely, DRAMs), and connects the chip areas CA1 to each other.

The scribe area SA3 extends to the lateral direction in FIG. 8 and has a shift register SR2, a clock pad CP, a data pad DP, a voltage pad VP, and a connecting switch circuit SC2 for each chip row CR1. The clock pad CP, the data pad DP, and the voltage pad VP are positioned adjacent to the head chip area CA1 (the chip area CA1 on the left end in the drawing) that is the chip area corresponding to a latch circuit on an initial stage in the shift register SR2. Further, the scribe area SA3 has dummy pads P1 to P3 for each of the succeeding chip areas CA1 that are the chip areas excluding the head chip area CA1, the dummy pads P1 to P3 being provided adjacent to the respective succeeding chip areas CA1. A relative position of each of the succeeding chip areas CA1 to the corresponding dummy pads P1 to P3 is designed to be the same as that of each of the head chip areas CA1 to the corresponding clock pad CP, data pad DP, and voltage pad VP. Therefore, even when a probe card (for example, the probe card PC1 in FIG. 4) having probes brought into contact with pads in each of the head chip areas CA1, and the clock pad CP, data pad DP, and voltage pad VP corresponding to each of the head chip areas CA1 is used for each of the succeeding chip areas CA1 in a test process of the semiconductor wafer W3, the probes come in contact with pads in each of the succeeding chip areas CA1, and the dummy pads P1 to P3 corresponding to each of the succeeding chip areas CA1, respectively. As a result, it is possible to prevent the occurrence of a continuity failure that is caused by tips of the probes made in contact with a silicon substrate and insulating substance adhering thereto.

Here, the test process of the semiconductor wafer W3 in FIG. 8 will be described.

First, through the use of the probe card PC1 (FIG. 4), a function test is conducted on the chip areas CA1 in the same chip row CR1. At this time, the chip areas CA1 where defects in the DRAMs are detected by the function test and failed addresses thereof are stored. Next, through the use of the probe card PC1 without any probe card exchange, the probes are brought into contact with the pads in the head area CA1, the clock pad CP, the data pad DP, and the voltage pad VP respectively to execute a failed address programming process for the chip areas CA1 in the same chip row CR1 as in the first embodiment. Therefore, similarly to the second embodiment, the electric fuse circuits FC in the chip areas CA1 in the same chip row CR1 are cut off at a time. This further shortens the time required for the cutoff process of the electric fuse circuits FC compared with the case where the electric fuse circuits FC are cut off in a unit of the chip area CA1 (first embodiment). Therefore, the time required for the test process of the semiconductor wafer W3 is further shortened.

Further, it is not necessary to exchange probe cards when the process proceeds from the function test to the cutoff processing of the electric fuse circuits FC, thereby reducing man-hours of the test process of the semiconductor wafer W3.

As described above, the same effects as those of the first and second embodiments are also obtainable in the third embodiment. In addition, since no probe card exchange operation is required when the process proceeds to the cutoff processing of the electric fuse circuits FC from the function test, man-hours of the test process of the semiconductor wafer W3 can be reduced.

Figure 9:
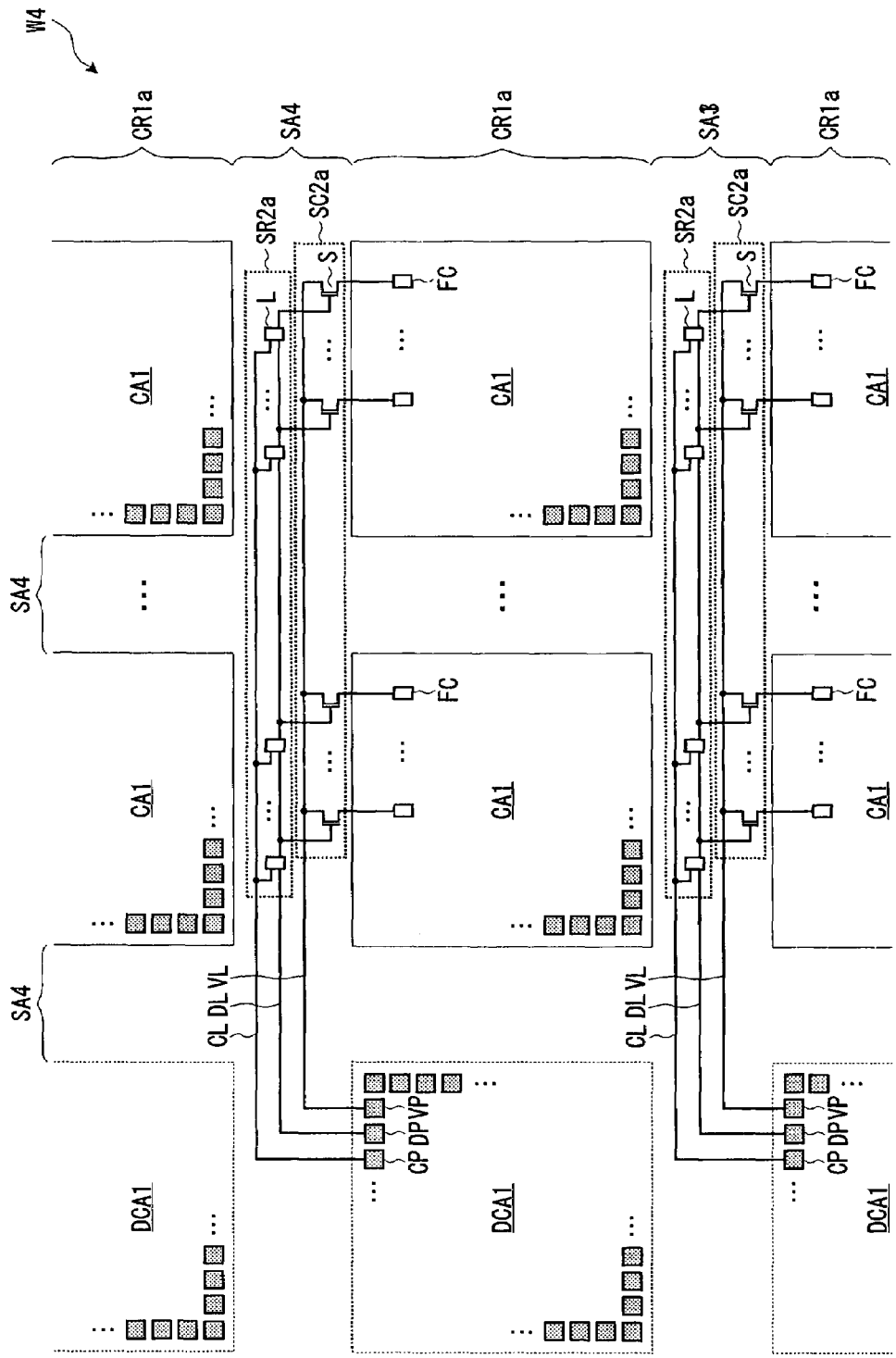
FIG. 9 shows a fourth embodiment of the semiconductor integrated circuit of the present invention.

FIG. 9 shows the semiconductor integrated circuit according to the fourth embodiment of the present invention. The same reference numerals and symbols are used to designate the same element as the elements described in the first and second embodiments, and detailed explanation thereof will be omitted.

The semiconductor integrated circuit of the present invention is formed as a semiconductor wafer W4 having a plurality of chip areas CA1 and a scribe area (peripheral area) SA4. Similarly to the scribe area SA1 of the first embodiment, the scribe area SA4 is an area that is cut in a dicing process of the chip areas CA1 (namely, DRAMs), and connects the chip areas CA1 to each other.

The scribe area SA3 extends to the lateral direction in FIG. 9 and has a shift register SR2a and a connecting switch circuit SC2a for each chip row CR1a. The configuration of the shift register SR2a is the same as that of the shift register SR2 of the second embodiment except the number of latch circuits L. The configuration of the connecting switch circuit SC2a is the same as the connecting switch circuit SC2 of the second embodiment except the number of switches S. The configuration of the chip row CR1a is the same as that of the chip row CR1 in the second embodiment except the number of the chip areas CA1.

The scribe area SA4 has a dummy chip area DCA1 having the same pad arrangement as that of each of the chip areas CA1, the dummy chip area DCA1 being provided for each of the chip rows CR1a at a position adjacent to the head chip area CA1 (the chip area CA1 in the middle in the drawing) that is the chip area corresponding to a latch circuit L on an initial stage in the shift register SR2a. Three of pads in each of the dummy chip areas DCA1 are a clock pad CP, a data pad DP, and a voltage pad VP.

Here, a test process of the semiconductor wafer 4 in FIG. 9 will be described.

First, through the use of the probe card PC2 for function test (FIG. 6), a function test is conducted on the chip areas CA1 in the same chip row CR1. At this time, the chip areas CA1 where defects in the DRAMs are detected by the function test and failed addresses thereof are stored. Next, through the use of the probe card PC2 without any probe card exchange, the probes are brought into contact with the pads (including the clock pad CP, the data pad DP, and the voltage pad VP) in the dummy chip area DCA1 respectively, and a failed address programming process is executed for the chip areas CA1 in the same chip row CR1 as in the first embodiment. Therefore, similarly to the second embodiment, the cutoff processing is executed on the electric fuse circuits FC in the chip areas CA1 in the same chip row CR1 at the same time. This further shortens the time required for the cutoff process of the electric fuse circuits FC compared with the case where the cutoff processing is executed on the electric fuse circuits FC in a unit of the chip area CA1 (first embodiment).

Accordingly, the time required for the test process of the semiconductor wafer W4 is further shortened. In addition, without probe card exchange at the transition from the function test to the cutoff processing of the electric fuse circuits FC similarly to the third embodiment, it is able to reduce man-hours of the test process of the semiconductor wafer W4.

The above-described fourth embodiment also attains the same effect as that of the first through third embodiments.

Figure 10:
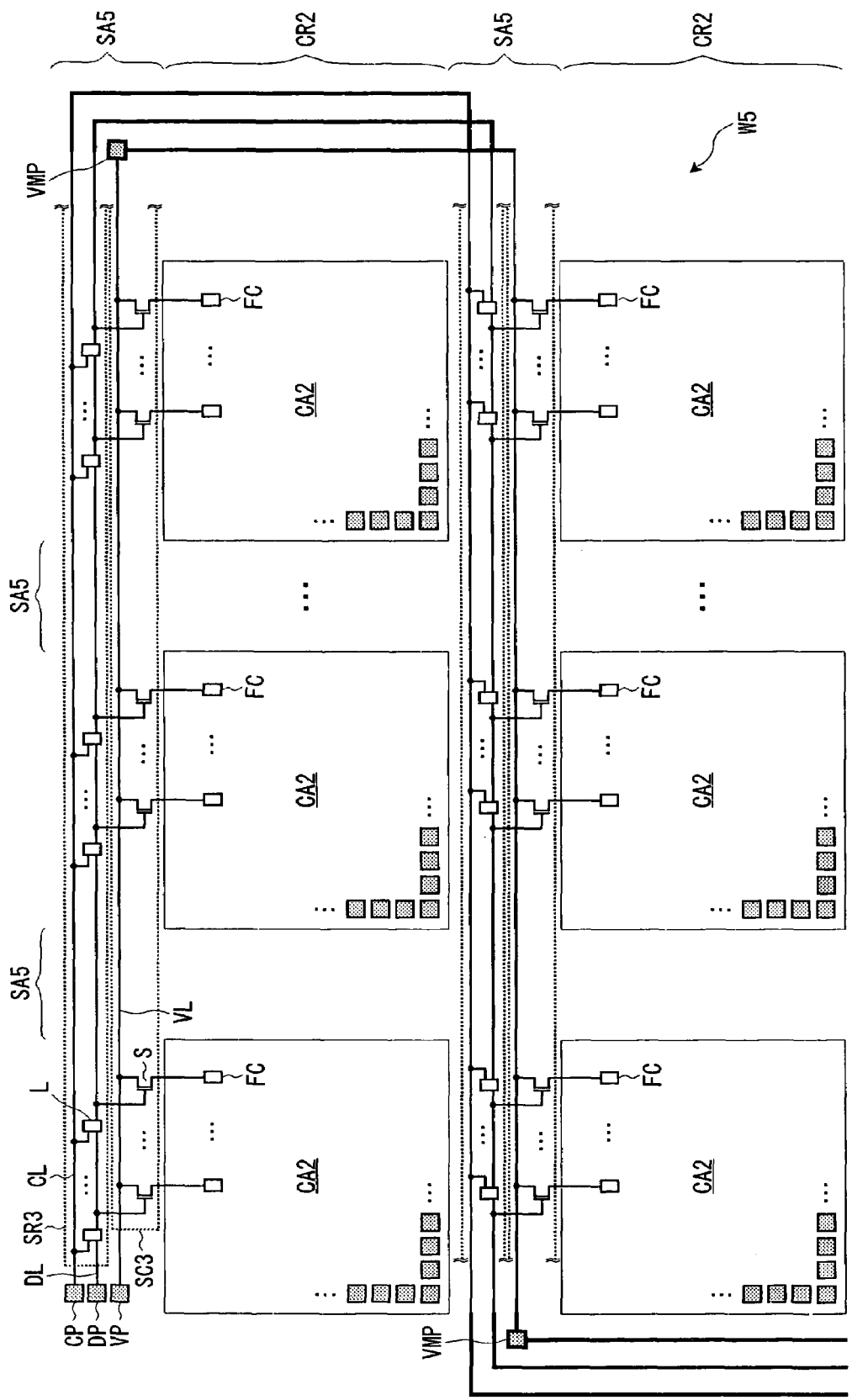
FIG. 10 shows a fifth embodiment of the semiconductor integrated circuit of the present invention.

FIG. 10 shows the semiconductor integrated circuit according to the fifth embodiment of the present invention. The same reference numerals and symbols are used to designate the same element as the elements described in the first embodiment, and detailed explanation thereof will be omitted.

The semiconductor integrated circuit of the present invention is formed as a semiconductor wafer W5 having a plurality of chip areas CA2 and a scribe area (peripheral area) SA5. A semiconductor chip formed in each of the chip areas CA2 has, for example, a PLL circuit (not shown) generating an internal clock used in the semiconductor chip. The scribe area SA5 is an area that is cut in a dicing process the chip areas CA2 (that is, the semiconductor chips) and connects the chip areas CA2 to each other.

Each of the chip areas CA2 has a plurality of electric fuse circuits FC for programming trimming information of the PLL circuit. The scribe area SA5 extends to the lateral direction in FIG. 10 and has a shift register SR3, a clock pad CP, a data pad DP, a voltage pad VP, and a connecting switch circuit SC3 common to all chip rows CR2. Here, the chip rows CR2 are each constituted of the chip areas CA2 aligned in a row in the lateral direction in FIG. 10.

The scribe area SA5 has connecting patterns of clock supply lines CL, connecting patterns between data terminals of latch circuits L, connecting patterns of voltage supply lines VL (the heavy line portions on the right and left sides of each of the chip rows CR2 in the drawing) in order to couple the clock supply lines CL, the latch circuits L, and the voltage supply lines VL respectively that correspond to the chip rows CR2 adjacent to each other. These connecting patterns are formed by direct lithography with an EB (electron beam).

Further, the scribe area SA5 has a voltage monitor pad VMP on each of the connecting patterns of the voltage supply lines VL. Since an amount of voltage drop in the voltage supply lines VL can be monitored via the voltage monitor pads VMP, it is possible to judge from the voltage drop amount in the voltage supply lines VL whether or not electric fuses F in electric fuse circuits FC are normally cut off.

The configuration of the shift register SR3 is the same as that of the shift register SR2 of the second embodiment except the number of the latch circuits L. The configuration of the connecting switch circuit SC3 is the same as that of the connecting switch circuit SC2 of the second embodiment except the number of switches S. The clock pad CP, the data pad DP, and the voltage pad VP are positioned adjacent to the head chip area CA2 (the uppermost chip area CA2 on the left end in the drawing) that is a chip area corresponding to the latch circuit L on an initial stage in the shift register SR3.

Here, a test process of the semiconductor wafer W5 in FIG. 10 will be described.

First, a function test is conducted on all the chip areas CA2 in the semiconductor wafer W5a by use of a probe card that has, similarly to the probe card PC2 (FIG. 6), only probes brought into contact with pads in each of the chip areas CA2 (namely, a probe card for function test). Here, stored are the chip area CA2 where a marginal failure of the semiconductor chip is detected by the function test and trimming information for correcting the marginal failure.

Next, the probes are brought into contact with the clock pad CP, the data pad DP, and the voltage pad, respectively, by use of a probe card that has, similarly to the probe card PC3 (FIG. 7), only probes brought into contact with the clock pad CP, the data pad DP, and the voltage pad VP respectively (namely, a probe card for trimming information programming process). Then, the chip areas CA2 in all the chip rows CR2 (namely, all the chip areas CA2) are subjected to the programming processing of trimming information on the PLL circuit, similarly to the failed address programming processings in the first embodiment. Therefore, the electric fuse circuits FC in all the chip areas CA2 in the semiconductor wafer W5 are concurrently blown out. This further shortens the time required for the cutoff process of the electric fuse circuits FC compared with the case where the cutoff processing on the electric fuse circuits FC is executed in a unit of the chip areas CA2 (first embodiment) or in a unit of the chip rows CR2 (second embodiment). Accordingly, the time required for the test process of the semiconductor wafer W5 is further shortened.

As described above, the same effects as those of the first and second embodiments are also obtainable in the fifth embodiment. In addition, since the clock pad CP, the data pad DP, and the voltage pad VP are common to the electric fuse circuits FC in the chip areas CA2 in all the chip rows CR2, the size of the scribe area SA5 can be further reduced compared with the case where the clock pad CP, the data pad DP, and the voltage pad VP are provided for each of the chip areas CA2 or for each of the chip rows CR2. This allows further increase in the number of semiconductor chips producible from the semiconductor wafer W5, resulting in further reduced manufacturing cost of the semiconductor chips.

Further, the electric fuse circuits FC in the chip areas CA2 in all the chip rows CR2 can be cut off at the same time, so that it is able to shorten the time required for the cutoff process of the electric fuse circuits FC compared with the case where the electric fuse circuits are cut off in a unit of the chip areas CA2 or in a unit of the chip rows CR2. Therefore, the time required for the test process of the semiconductor wafer W5 can be further shortened. Moreover, a voltage drop in the voltage supply lines VL can be monitored via the voltage monitor pad VMP, thereby preventing the electric fuses F in the electric fuse circuits FC from being erroneously cut off.

Figure 11:
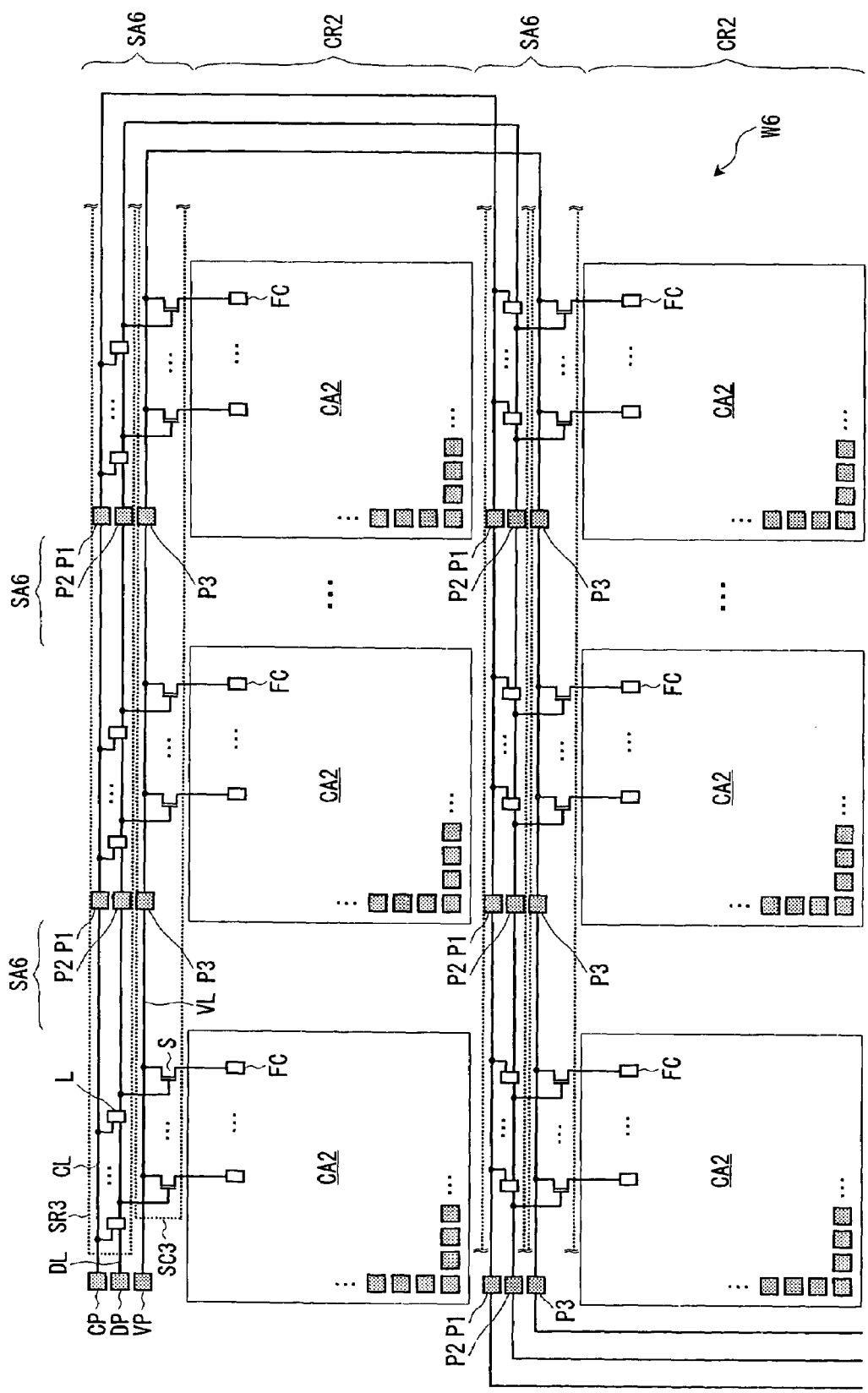
FIG. 11 shows a sixth embodiment of the semiconductor integrated circuit of the present invention.

FIG. 11 shows the semiconductor integrated circuit according to the sixth embodiment of the present invention. The same reference numerals and symbols are used to designate the same element as the elements described in the first, third, and fifth embodiments, and detailed explanation thereof will be omitted.

The semiconductor integrated circuit of the present invention is formed as a semiconductor wafer W6 having a plurality of chip areas CA2 and a scribe area (peripheral area) SA6. Similarly to the scribe area SA1 of the first embodiment, the scribe area SA 6 is an area to cut in a dicing process of the chip areas CA2 (that is, the semiconductor chips) and connects the chip areas CA2 to each other.

The scribe area SA6 extends to the lateral direction in FIG. 11 and has a shift register SR3, a clock pad CP, a data pad DP, a voltage pad VP, and a connecting switch circuit SC3 that are common to all chip rows CR2. The clock pad CP, the data pad DP, and the voltage pad VP common to all the chip rows CR2 are positioned adjacent to the head chip area CA2 (the uppermost chip area CA2 on the left end in the drawing) that is the chip area corresponding to a latch circuit L on an initial stage in the shift register SR3. Further, the scribe area SA6 has dummy pads P1 to P3 for each of the succeeding chip areas CA2 that are the chip areas excluding the head chip area CA2, the dummy pads P1 to P3 being positioned adjacent to each of the succeeding chip areas CA2. The relative position of each of the succeeding chip areas CA2 to the corresponding dummy pads P1 to P3 is designed to be the same as that of the head chip area CA2 to the clock pad CP, the data pad DP, and the voltage pad VP. Therefore, even when a probe card having probes brought into contact with pads in the head chip area CA2, the clock pad CP, the data pad DP, and the voltage pad VP respectively is used for each of the succeeding chip areas CA2 in a test process of the semiconductor wafer W6, the probes come in contact with pads in each of the succeeding chip areas CA2 and the dummy pads P1 to P3 corresponding to each of the succeeding chip areas CA2 respectively. As a result, it is possible to prevent the occurrence of a continuity failure that is caused by tips of the probes made in contact with a silicon substrate and insulating substance adhering thereto. Further, similarly to the scribe area SA5 of the fifth embodiment, the scribe area SA6 has connecting patterns of clock supply lines CL, connecting patterns between data terminals of latch circuits L, and connecting patterns of voltage supply lines VL. All the connecting patterns are formed by direct lithography with an EB (electron beam).

Here, the test process of the semiconductor wafer W6 in FIG. 11 will be described.

First, the probe card having, similarly to the probe card PC1 (FIG. 4), probes brought into contact with the pads in each of the chip areas CA2 and in addition, probes brought into contact with the clock pad CP, the data pad DP, and the voltage pad VP is used to conduct a function test on all the chip areas CA2 in the semiconductor wafer W6. Here, stored are the chip area CA2 where a marginal failure in the semiconductor chip is detected by the function test and trimming information for correcting the marginal failure.

Next, without any probe card exchange, the probes are brought into contact with the pads in the head chip area CA2, the clock pad CP, the data pad DP, and the voltage pad VP respectively. Then, similarly to the failed address programming process in the first embodiment, a trimming information programming process of a PLL circuit is executed for the chip areas CA2 in all the chip rows CR2 (namely, all the chip areas CA2). Therefore, the electric fuse circuits FC in all the chip areas CA2 in the semiconductor wafer W6 are executed at a time. This further shortens the time required for the cutoff process of the electric fuse circuits FC compared with the case where the electric fuse circuits FC is cut off in a unit of the chip areas CA2 (first embodiment) or in a unit of the chip rows CR2 (second embodiment).

Accordingly, the time required for the test process of the semiconductor wafer W6 is further shortened. In addition, since no probe card exchange is required at the transition from the function test to the cutoff process of the electric fuse circuits FC, similarly to the third embodiment, man-hours of the test process of the semiconductor wafer W6 can be reduced.

The above-described sixth embodiment also attains the same effect as that of the first, third, fifth embodiments.

Figure 12:
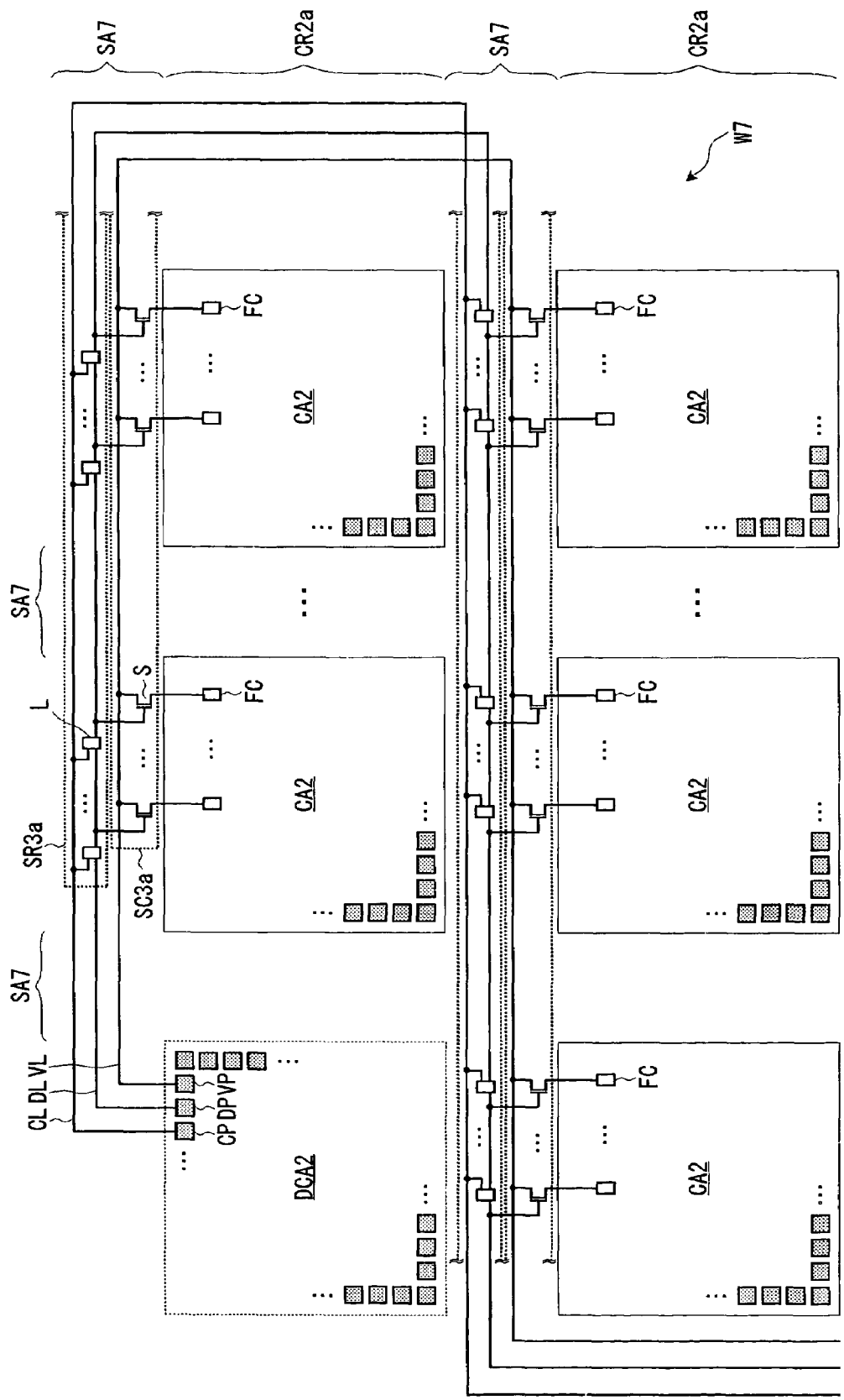
FIG. 12 shows a seventh embodiment of the semiconductor integrated circuit of the present invention.

FIG. 12 shows the semiconductor integrated circuit according to the seventh embodiment of the present invention. The same reference numerals and symbols are used to designate the same element as the elements described in the first, fourth, and fifth embodiments, and detailed explanation thereof will be omitted.

The semiconductor integrated circuit of the present invention is formed as a semiconductor wafer W7 having a plurality of chip areas CA2 and a scribe area (peripheral area) SA7. Similarly to the scribe area SA1 of the first embodiment, the scribe area SA7 is an area to cut in a dicing process of the chip areas CA2 (that is, the semiconductor chips) and connects the chip areas CA2 to each other.

The scribe area SA7 extends to the lateral direction in FIG. 12 and has a shift register SR3a and a connecting switch circuit SC3a common to all chip rows CR2a. The configuration of the shift register SR3a is the same as that of the shift register SR3 of the fifth embodiment except the number of latch circuits L. The configuration of the connecting switch circuit SC3a is the same as that of the connecting switch circuit SC3 of the fifth embodiment except the number of switches S. The configuration of the chip row CR2a is the same as that of the chip row CR2 of the fifth embodiment except the number of the chip areas CA2.

The scribe area SA7 has a dummy chip area DCA2 having the same pad arrangement as that of each of the chip areas CA2, the dummy chip area DCA2 being common to all chip rows CR2a and positioned adjacent to the head chip area CA2 that is the chip area corresponding to the latch circuit L on an initial stage in the shift register SR2a (the chip area CA2 in the upper middle in the drawing). Three of pads in the dummy chip area DCA2 are a clock pad CP, a data pad DP, and a voltage pad VP. Further, the scribe area SA7 has, similarly to the scribe area SA5 of the fifth embodiment, connecting patterns of clock supply lines CL, connecting patterns between data terminals of the latch circuits L, and connecting patterns of voltage supply lines VL, all the connecting patterns being formed by direct lithography with an EB (electron beam).

Here, a test process of the semiconductor wafer W7 in FIG. 12 will be described.

First, a probe card having, similarly to the probe card PC2 (FIG. 4), only probes brought into contact with pads in each of the chip areas CA2 respectively is used to conduct a function test on all the chip areas CA2 in the semiconductor wafer W7. Here, stored are the chip area CA2 where a marginal failure of the semiconductor chip is detected by the function test and trimming information for correcting the marginal failure.

Next, without any probe card exchange, the probes are brought into contact with the pads (including the clock pad CP, the data pad DP, and the voltage pad VP) in the dummy chip area DCA2 respectively. Then, similarly to the failed address programming process in the first embodiment, a trimming information programming process of a PLL circuit is executed for the chip areas CA2 in all the chip rows CR2a (namely, all the chip areas CA2). Therefore, the electric fuse circuits FC of all the chip areas CA2 in the semiconductor wafer W7 are blown out at the same time. This further shortens the time required for the cutoff process of the electric fuse circuits FC compared with the case where the electric fuse circuits FC are cut off in a unit of the chip area CA2 (first embodiment) or in a unit of the chip rows CR2a (second embodiment).

Accordingly, the time required for the test process of the semiconductor wafer W7 is further shortened. Moreover, since no probe card exchange is required at the transition from the function test to the cutoff processing of the electric fuse circuits FC similarly to the fourth embodiment, man-hours of the test process of the semiconductor wafer W7 are reduced.

As described above, the same effects as those of the first, third, and fifth embodiments are also obtainable in the seventh embodiment.

In the examples described in the first to fourth embodiments, the present invention is applied to the semiconductor wafer in which the DRAM having the redundancy circuit is formed in each of the chip areas CA1. The present invention is not limited to such embodiments. The present invention may be applied to, for example, a semiconductor wafer in which a different semiconductor memory (an SRAM, a flash memory, or the like) having a redundancy circuit is formed in each of the chip areas.

In the examples described in the fifth to seventh embodiments, the present invention is applied to the semiconductor wafer in which the semiconductor chip having the PLL circuit is formed in each of the chip areas CA2. The present invention is not limited to such embodiments. The present invention may be applied to, for example, a semiconductor wafer in which a different timing circuit (a DLL circuit, a delay circuit, or the like) generating a desired timing signal is formed in each chip area. In this case, electric fuse circuits store trimming information for adjusting the generation timing of the timing signal in the timing circuit.

In the examples described in the fifth to seventh embodiments, the connecting patterns of the clock supply lines CL, the connecting patterns between the data terminals of the latch circuits L, and the connecting patterns of the voltage supply lines VL for coupling the clock supply lines CL, the latch circuits, and the voltage supply lines VL respectively which are disposed to correspond to the chip rows adjacent to each other are formed by the direct lithography with the EB (electron beam). The present invention is not limited to such embodiments. These connecting patterns may be formed by, for example, transfer using a specialized mask or a specialized reticle.

The invention is not limited to the above embodiments and various modifications may be made without departing from the spirit and scope of the invention. Any improvement may be made in part or all of the components.

What is claimed is:

1. A semiconductor integrated circuit comprising: a plurality of chip areas each having a semiconductor chip formed therein; and a peripheral area connecting the chip areas with each other, wherein:
    each of said chip areas includes a plurality of electric fuse circuits each for programming control information on an internal circuit of the semiconductor chip; and
    said peripheral area includes: a shift register composed of a plurality of latch circuits corresponding to said electric fuse circuits, respectively; a clock pad connected via a clock supply line to a clock terminal of each of the latch circuits in said shift register; a data pad connected via a data supply line to a data terminal of one of the latch circuits on an initial stage in said shift register; a voltage pad connected to a voltage supply line; and a connecting switch circuit composed of a plurality of switches corresponding to said electric fuse circuits, respectively, and connecting the voltage supply line to a corresponding one of the electric fuse circuits according to outputs of said latch circuits in said shift register.

2. The semiconductor integrated circuit according to claim 1, wherein:
said peripheral area has, for each of said chip areas, said shift register, said clock pad, said data pad, said voltage pad, and said connecting switch circuit; and
relative positions of said clock pads, said data pads, and said voltage pads to said chip areas are identical with each other.

3. The semiconductor integrated circuit according to claim 1, wherein
said peripheral area includes, for each chip row as chip areas in a row, said shift register, said clock pad, said data pad, said voltage pad, and said connecting switch circuit.

4. The semiconductor integrated circuit according to claim 3, wherein:
said clock pad, said data pad, and said voltage pad are provided in a portion of said peripheral area corresponding to a head chip area that is associated with the latch circuit on the initial stage in said shift register;
said peripheral area includes three dummy pads for each of chip areas succeeding said head chip area; and
a relative position of the three dummy pads to each of the succeeding chip areas are identical with a relative position of said clock pad, said data pad, and said voltage pad relative to each of the head chip areas.

5. The semiconductor integrated circuit according to claim 3, wherein:
said peripheral area includes, for each of the chip rows, a dummy chip area having a same pad arrangement as a pad arrangement in each of said chip areas; and
three of pads in each of said dummy chip areas are said clock pad, said data pad, and said voltage pad.

6. The semiconductor integrated circuit according to claim 1, wherein
said peripheral area includes said shift register, said clock said pad, said data pad, said voltage pad, and said connecting switch circuit which are common to all of chip rows as chip areas in rows.

7. The semiconductor integrated circuit according to claim 6, wherein:
said clock pad, said data pad, and said voltage pad are provided in a portion of said peripheral area corresponding to a head chip area that is associated with the latch circuit on the initial stage in said shift register;
said peripheral area has three dummy pads for each of chip areas succeeding said head chip area; and
a relative position of the three dummy pads relative to each of the succeeding chip areas is identical with a relative position of said clock pad, said data pad, and said voltage pad relative to said head chip area.

8. The semiconductor integrated circuit according to claim 6, wherein:
said peripheral area includes a dummy chip area which is common to all of chip rows, the dummy chip area having a same pad arrangement as a pad arrangement in each of said chip areas; and
three of pads in said dummy chip area are said clock pad, said data pad, and said voltage pad.

9. The semiconductor integrated circuit according to claim 6, wherein
said peripheral area has a connecting pattern of the clock supply lines, a connecting pattern of data terminals of the latch circuits, and a connecting pattern of the voltage supply lines so as to couple to one other the clock supply lines, the latch circuits, and the voltage supply lines all disposed for the chip rows adjacent to each other, respectively, all of the connecting patterns being formed by direct lithography with use of an electron beam.

10. The semiconductor integrated circuit according to claim 9, wherein
said peripheral area includes a voltage monitor pad on the connecting pattern of the voltage supply lines.

11. The semiconductor integrated circuit according to claim 1, wherein
said peripheral area is a scribe area to cut to separate said chip areas from each other.

12. The semiconductor integrated circuit according to claim 1, wherein:
the semiconductor chip formed in each of said chip areas is a semiconductor memory having a redundancy circuit for defect relief; and
when the semiconductor memory has a defect, said electric fuse circuits store therein an address designating a portion having the defect.

13. The semiconductor integrated circuit according to claim 1, wherein:
the semiconductor chip formed in each of said chip areas has a timing circuit which generates a desired timing signal; and
each of said electric fuse circuits stores therein trimming information for adjusting a timing at which the timing signal is generated by said timing circuit.

* * * * *